（12） United States Patent
Shin et al.

(10) Patent No.: US 12,150,364 B2
(45) Date of Patent: Nov. 19, 2024

(54) DISPLAY DEVICE

(71) Applicant: LG DISPLAY CO., LTD., Seoul (KR)

(72) Inventors: Youngsub Shin, Goyang-si (KR); Daeheung Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 463 days.

(21) Appl. No.: 17/514,340

(22) Filed: Oct. 29, 2021

(65) Prior Publication Data
US 2022/0199700 A1 Jun. 23, 2022

(30) Foreign Application Priority Data

Dec. 17, 2020 (KR) .......................... 10-2020-0177306

(51) Int. Cl.
| | |
|---|---|
| *H10K 59/40* | (2023.01) |
| *G06F 3/041* | (2006.01) |
| *G06F 3/044* | (2006.01) |
| *H10K 50/844* | (2023.01) |
| *H10K 50/856* | (2023.01) |
| *H10K 50/858* | (2023.01) |

(52) U.S. Cl.
CPC ........... *H10K 59/40* (2023.02); *G06F 3/0412* (2013.01); *G06F 3/0446* (2019.05); *G06F 3/0448* (2019.05); *H10K 50/844* (2023.02); *H10K 50/856* (2023.02); *H10K 50/858* (2023.02)

(58) Field of Classification Search
CPC .... H10K 59/40; H10K 50/856; H10K 50/858; G06F 3/0448; G06F 3/0412; G06F 2203/04112
See application file for complete search history.

(56) References Cited

U.S. PATENT DOCUMENTS

2020/0312930 A1* 10/2020 Choi ...................... H10K 50/19
2021/0175300 A1* 6/2021 Kim ..................... H10K 50/858

FOREIGN PATENT DOCUMENTS

KR 20080028403 A * 3/2008
KR 10-2020-0075597 A 6/2020

* cited by examiner

*Primary Examiner* — Mary A Wilczewski
*Assistant Examiner* — Nathan Pridemore
(74) *Attorney, Agent, or Firm* — Birch, Stewart, Kolasch & Birch, LLP

(57) ABSTRACT

A display device includes an encapsulation layer disposed to cover a plurality of organic light-emitting elements arranged in a display area of a substrate, and a mesh-shaped touch electrode disposed on the encapsulation layer. In this connection, a light control layer is disposed on the touch electrode. The light control layer includes a plurality of prism patterns arranged to correspond respectively to a plurality of openings of the touch electrode, and a plurality of reflective partition walls respectively surrounding the plurality of prism patterns. Accordingly, a viewing angle of the display device is controlled and a front-directional luminance thereof is improved.

17 Claims, 9 Drawing Sheets

DISPLAY DEVICE

CROSS-REFERENCE TO RELATED APPLICATION

This application claims a priority benefit under 35 U.S.C. § 119(a) to Korean Patent Application No. 10-2020-0177306 filed on Dec. 17, 2020, in the Korean Intellectual Property Office, the contents of which are hereby expressly incorporated by reference for all purposes into the present application.

BACKGROUND

Field

The present disclosure relates to a display device capable of controlling a viewing angle.

Description of Related Art

With the development of display device technology, display devices using various schemes have been developed, such as liquid crystal display devices (LCD), organic light-emitting display devices (OLED), and the like.

Use of a display device that can recognize a user's touch in addition to displaying an image is increasing. As a result, a display device having a touch sensing layer embedded therein is being developed.

Further, a display device to provide a variety of information has been used in vehicles such as automobiles. For example, in order to prevent an image from the display device from being reflected from a windshield of the vehicle and thus from obstructing a driver's vision, a separate light control film that blocks light emitted upwards from the display device (i.e., controls or cuts off a vertical directional viewing angle) is attached to the surface of a panel of the display device. However, when the light control film is attached to the surface of the panel of the display device, a luminance of the display device can be deteriorated and a touch sensitivity can be deteriorated.

SUMMARY OF THE DISCLOSURE

Therefore, the inventors of the present disclosure have invented a display device that can control or cut off a viewing angle without attaching the light control film to the surface of the panel.

A purpose of the present disclosure is to provide a display device in which the viewing angle can be controlled or cut off, and a front-directional luminance can be improved via improvement of light condensing efficiency.

Another purpose of the present disclosure is to provide a display device in which the viewing angle can be controlled or cut off while touch sensitivity may not be deteriorated.

Purposes according to the present disclosure are not limited to the above-mentioned purpose. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims and combinations thereof.

According to one embodiment of the present disclosure, a display device comprises an encapsulation layer disposed to cover a plurality of organic light-emitting elements arranged in a display area of a substrate, and a mesh-shaped touch electrode disposed on the encapsulation layer. In this connection, a light control layer can be disposed on the touch electrode. The light control layer can include a plurality of prism patterns respectively arranged to correspond to a plurality of openings of the touch electrode, and a plurality of reflective partition walls respectively surrounding the plurality of prism patterns. Accordingly, according to one embodiment of the present disclosure, the viewing angle of the display device can be controlled and the front-directional luminance can be improved.

The plurality of organic light-emitting elements can have mutually-separated cathodes, respectively. Moreover, a second inorganic encapsulation film of the encapsulation layer can include a plurality of openings respectively arranged to correspond to the plurality of prism patterns.

According to an embodiment of the present disclosure, the light control layer including the plurality of prism patterns and the plurality of reflective partition walls respectively surrounding the plurality of prism patterns can be disposed on the encapsulation layer covering the organic light-emissive elements. Thus, a vertical viewing angle and/or a horizontal viewing angle can be controlled or cut off, and the front-directional luminance can be improved via improvement of the light condensing efficiency.

Further, according to an embodiment of the present disclosure, power consumption can be lowered via the improved front-directional luminance.

According to one embodiment of the present disclosure, providing the above-described light control layer under a polarizing plate can allow the viewing angle to be controlled or cut off without deteriorating the touch sensitivity.

According to one embodiment of the present disclosure, the plurality of organic light-emitting elements can have mutually-separated cathodes, respectively. The second inorganic encapsulation film of the encapsulation layer can include the plurality of openings respectively arranged to correspond to the plurality of prism patterns. Thus, the viewing angle can be controlled to a narrower range.

Effects of the present disclosure are not limited to the above-mentioned effects, and other effects as not mentioned will be clearly understood by those skilled in the art from following descriptions.

BRIEF DESCRIPTION OF DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
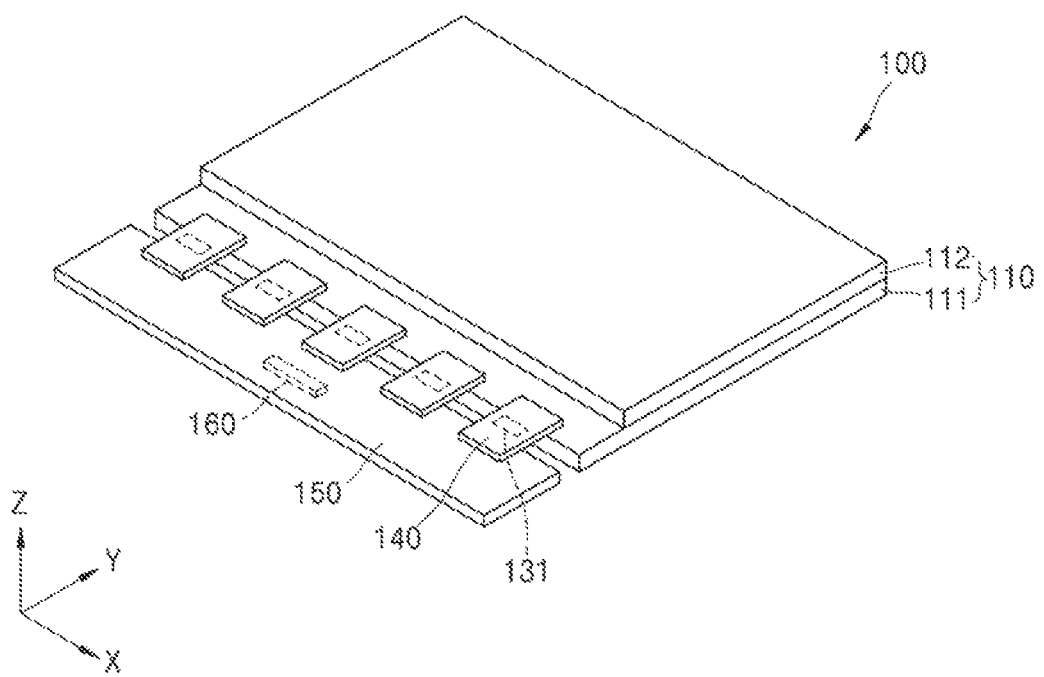
FIG. 1 is a perspective view of a touch display device according to one embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of display devices according to various embodiments of the present disclosure will be described. All the components of each display device according to all embodiments of the present disclosure are operatively coupled and configured.

Figure 2:
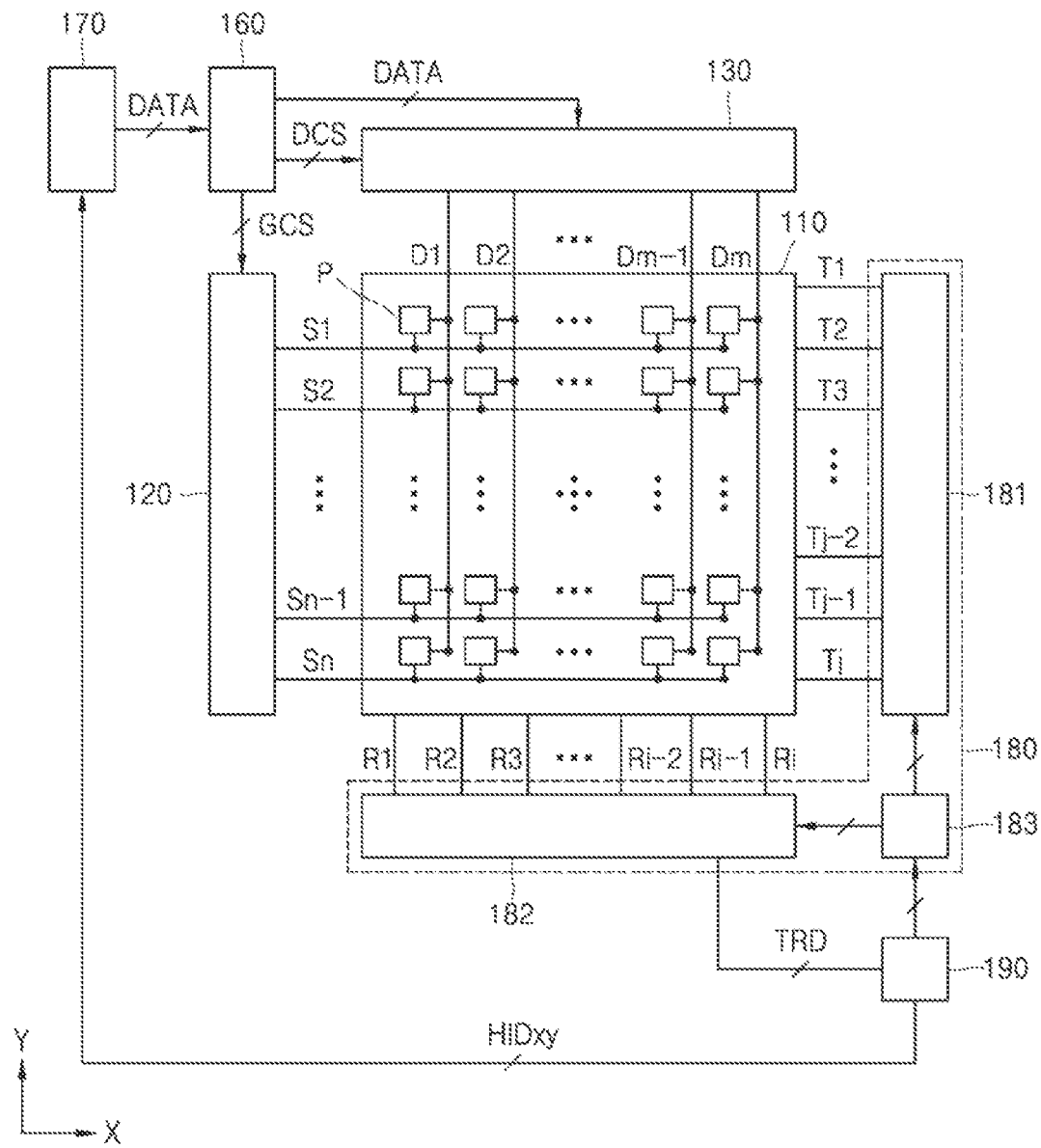
FIG. 2 is a block diagram of a touch display device according to one embodiment of the present disclosure.

FIG. 1 is a perspective view of a touch display device according to one embodiment of the present disclosure. FIG. 2 is a block diagram of the touch display device according to one embodiment of the present disclosure.

Referring to FIG. 1 and FIG. 2, a display device 100 according to one embodiment of the present disclosure includes a display panel 110, a scan driver 120, a data driver 130, a timing controller 160, a host system 170, a touch driver 180 and a touch coordinate calculator 190.

In the present disclosure, a case that the display device is implemented as an organic light-emitting display device (OLED) will be described by way of example. The present disclosure is not limited thereto. The display device can be implemented as various flat panel display devices such as a liquid crystal display device (LCD).

The display panel 110 includes a display area for displaying an image. The display area includes a plurality of pixels P. On the display panel 110, data lines D1 to Dm (m is a positive integer being 2 or greater than 2), scan lines S1 to Sn (n is a positive integer being 2 or greater than 2) are formed. The data lines D1 to Dm can intersect the scan lines S1 to Sn. The scan line can be embodied as a gate line. The pixels P can be respectively formed in areas defined by intersections of the scan lines and the data lines.

Each pixel P of the display panel 110 can be connected to one of the data lines D1 to Dm and one of the scan lines S1 to Sn.

Each pixel P of the display panel 110 can include a driving transistor that adjusts a current between a drain and a source thereof according to a data voltage applied to a gate electrode thereof, a scan transistor which is turned on by a scan signal of the scan line to supply a data voltage of the data line to the gate electrode of the driving transistor, an organic light-emitting diode that emits light according to the current between the drain and the source of the driving transistor, and a capacitor for storing a voltage of the gate electrode of the driving transistor. Thus, each pixel P can emit light according to the current supplied to the organic light-emitting diode.

The scan driver 120 receives a scan control signal GCS from the timing controller 160. The scan driver 120 supplies scan signals to the scan lines S1 to Sn according to the scan control signal GCS.

The scan driver 120 can be formed in a non-display area on one side or both sides of the display area of the display panel 110 in a GIP (gate driver in panel) scheme. Alternatively, the scan driver 120 can be manufactured as a driving chip which can be mounted on a flexible film which can be attached to the non-display area on one side or both sides of the display area of the display panel 110 using a TAB (tape automated bonding) scheme.

The data driver 130 receives digital video data and a data control signal DCS from the timing controller 160. The data driver 130 converts the digital video data into an analog positive/negative data voltage according to the data control signal DCS and supplies the converted voltage to the data lines. For example, pixels to be supplied with the data voltage are selected based on the scan signals of the scan driver 120, and the data voltages are supplied to the selected pixels.

As shown in FIG. 1, the data driver 130 can include a plurality of source drive ICs 131. Each of the plurality of source drive ICs 131 can be mounted on a flexible film 140 using a COF (chip on film) or a COP (chip on plastic) scheme. The flexible film 140 can be attached on pads prepared in the non-display area of the display panel 110 using an anisotropic conductive film. Accordingly, the plurality of source drive ICs 131 can be respectively connected to the pads.

The circuit board 150 can be attached to the flexible film 140. A number of circuits implemented as driving chips can be mounted on the circuit board 150. For example, the timing controller 160 can be mounted on the circuit board 150. The circuit board 150 can be embodied as a printed circuit board or a flexible printed circuit board.

The timing controller 160 receives the digital video data and timing signals from the host system 170. The timing signals can include a vertical synchronization signal, a horizontal synchronization signal, a data enable signal, and a dot clock signal. The vertical synchronization signal refers to a signal defining one frame period. The horizontal synchronization signal refers to a signal that defines one horizontal period required to supply data voltages to pixels of a single horizontal line of the display panel DIS. The data enable signal refers to a signal that defines a period for which valid data is input. The dot clock signal refers a signal that is repeated at a predefined short cycle.

The timing controller 160 is used to control operation timings of the scan driver 120 and the data driver 130. To this end, the timing controller 160 can generate a data control signal DCS to control the operation timing of the data driver 130, and a scan control signal GCS to control the operation timing of the scan driver 120, based on the timing signals. The timing controller 160 outputs the scan control signal GCS to the scan driver 120, and outputs the digital video data and the data control signal DCS to the data driver 130.

The host system 170 can be implemented as a navigation system, a set-top box, a DVD player, a Blu-ray player, a personal computer (PC), a home theater system, a broadcast receiver, and a phone system. The host system 170 includes a SoC (System on chip) having a built-in scaler to convert the digital video data of an input image into a format suitable for display on the display panel 110. The host system 170 transmits the digital video data and the timing signals to the timing controller 160.

In addition to the data lines D1 to Dm and the scan lines S1 to Sn, first and second touch electrodes can be formed on the display panel 110. The first touch electrodes can intersect with the second touch electrodes. The first touch electrodes can be connected to a first touch driver 181 via first touch lines T1 to Tj (j is a positive integer greater than or equal to 2). The second touch electrodes can be connected to a second touch driver 182 via second touch lines R1 to Ri (i is a positive integer greater than or equal to 2). A touch sensor can be formed at each of the intersections between the first and second touch electrodes. In an embodiment of the present disclosure, it is illustrated that the touch sensor is implemented based on mutual capacitance. The present disclosure is not limited thereto.

The touch driver 180 supplies a drive pulse to the first touch electrodes via the first touch lines T1 to Tj and senses a charge variation of each of the touch sensors via the second touch lines R1 to Ri. Referring to FIG. 2, a case in which the first touch lines T1 to Tj are embodied as Tx lines for supplying the drive pulse, and the second touch lines R1 to Ri are embodied as Rx lines for sensing the charge variation of each touch sensor is described by way of example. However, the present disclosure is not limited thereto.

The touch driver 180 includes the first touch driver 181, the second touch driver 182, and a touch controller 183. The first touch driver 181, the second touch driver 182, and the touch controller 183 can be integrated into one ROIC (Read-out IC).

The first touch driver 181 selects a first touch line to output the drive pulse under control of the touch controller 183, and supplies the drive pulse to the selected first touch line. For example, the first touch driver 181 can sequentially supply the drive pulses to the first touch lines T1 to Tj.

The second touch driver 182 selects the second touch lines to receive the charge variations of the touch sensors under the control of the touch controller 183, and receives the charge variations of the touch sensors via the selected second touch lines. The second touch driver 182 samples the charge variations of the touch sensors received via the second touch lines R1 to Ri and converts the sampled charge variations into touch raw data (TRD) as digital data.

The touch controller 183 can generate a Tx setup signal to set the first touch line when the drive pulse is output from the first touch driver 181 and an Rx setup signal to set the second touch line when the second touch driver 182 receives a touch sensor voltage. Further, the touch controller 183 generates timing control signals to control operation timings of the first touch driver 181 and the second touch driver 182.

The touch coordinate calculator 190 receives the touch row data TRD from the touch driver 180. The touch coordinate calculator 190 calculates a touch coordinate(s) according to a touch coordinate calculation method, and outputs touch coordinate data HIDxy including information about the touch coordinate(s) to the host system 170.

The touch coordinate calculator 190 can be implemented using a MCU (Micro Controller Unit). The host system 170 analyzes the touch coordinate data HIDxy input from the touch coordinate calculator 190 and executes an application program linked to the coordinate that the user has touched. The host system 170 transmits the digital video data and the timing signals to the timing controller 160 according to the executed application program.

The touch driver 180 can be included in the source drive IC 131 or can be manufactured as a separate driving chip which in turn can be mounted on the circuit board 150. Further, the touch coordinate calculator 190 can be manufactured as a driving chip which can be mounted on the circuit board 150.

The display panel 110 includes a first substrate 111, a second substrate 112, and a thin-film transistor layer, a light-emitting element layer, an encapsulation layer, a touch sensing layer, and a light control layer disposed between the first and second substrates 111 and 112.

The first substrate 111 can be embodied as a glass substrate or a plastic substrate.

The thin-film transistor layer can be formed on the first substrate 111. The thin-film transistor layer can include scan lines, data lines, and thin-film transistors. Each of the thin-film transistors includes a gate electrode, a semiconductor layer, a source electrode, and a drain electrode. When the scan driver is formed in the GIP (gate driver in panel) scheme, the scan driver can be formed together with the thin-film transistor layer.

The light-emitting element layer can be formed on the thin-film transistor layer. In the present disclosure, an example in which the light-emitting element layer is embodied as an organic light-emitting element layer that uses a light-emitting element as an organic light-emitting element is described. The present disclosure is not limited thereto. The organic light-emitting element layer includes a first electrode, an organic light-emitting layer, a second electrode, and banks.

Each of the organic light-emitting layers can include a hole transporting layer, a light-emitting layer, and an electron transporting layer. In this case, when a voltage is applied across the first electrode and the second electrode, holes and electrons are moved to the light-emitting layer via the hole transport layer and the electron transport layer, respectively, and are combined with each other in the light-emitting layer to emit light. Since pixels are provided in an area where the organic light-emitting element layer is formed, the area where the organic light-emitting element layer is formed can be defined as the display area. A peripheral area around the display area can be defined as the non-display area.

The encapsulation layer is formed on the organic light-emitting element layer. The encapsulation layer serves to prevent the penetration of oxygen or moisture into the organic light-emitting element layer. The encapsulation layer can include at least one organic encapsulation film.

The touch sensing layer is formed on the encapsulation layer. The touch sensing layer includes first touch electrodes and second touch electrodes for sensing a user's touch. The touch sensing layer can include bridge electrodes electrically connecting the first touch electrodes to each other or electrically connecting the second touch electrodes to each other.

The light control layer including a prism pattern and a reflective partition wall is formed on the touch sensing layer.

The second substrate 112 can be embodied as a plastic film, a glass substrate, or an encapsulating film protective film. In some cases, the second substrate 112 can be omitted.

Hereinafter, a display device according to one or more embodiments of the present disclosure will be described in more detail with reference to FIG. 3 to FIG. 6.

Figure 3:
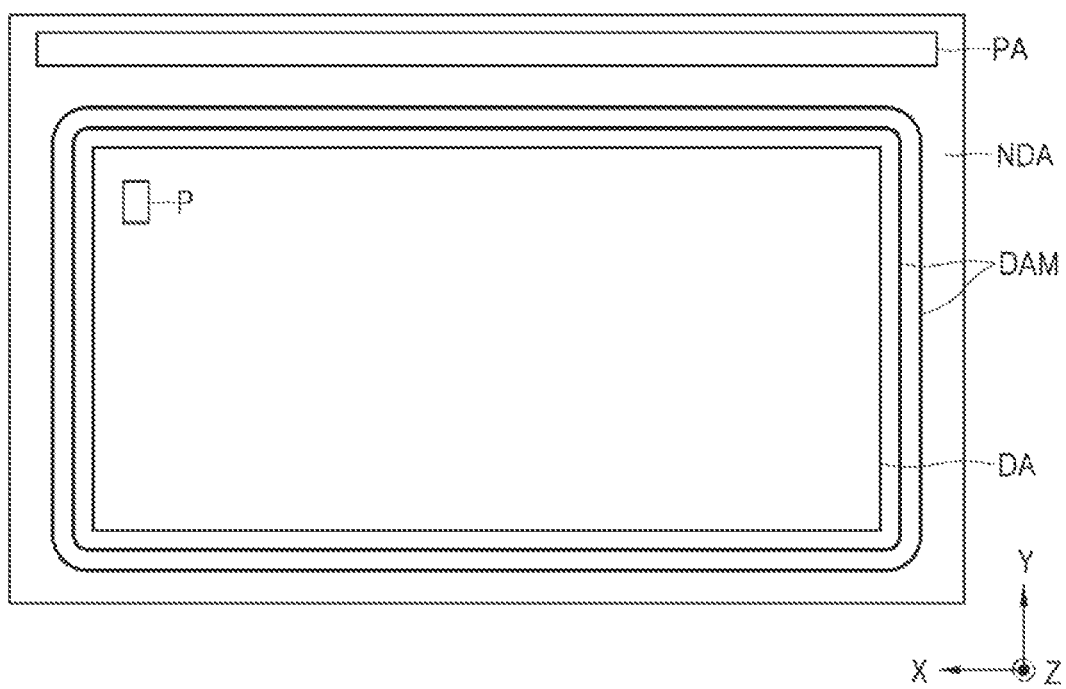
FIG. 3 is a schematic plan view of a first substrate of a touch display device according to one embodiment of the present disclosure.
Figure 4:
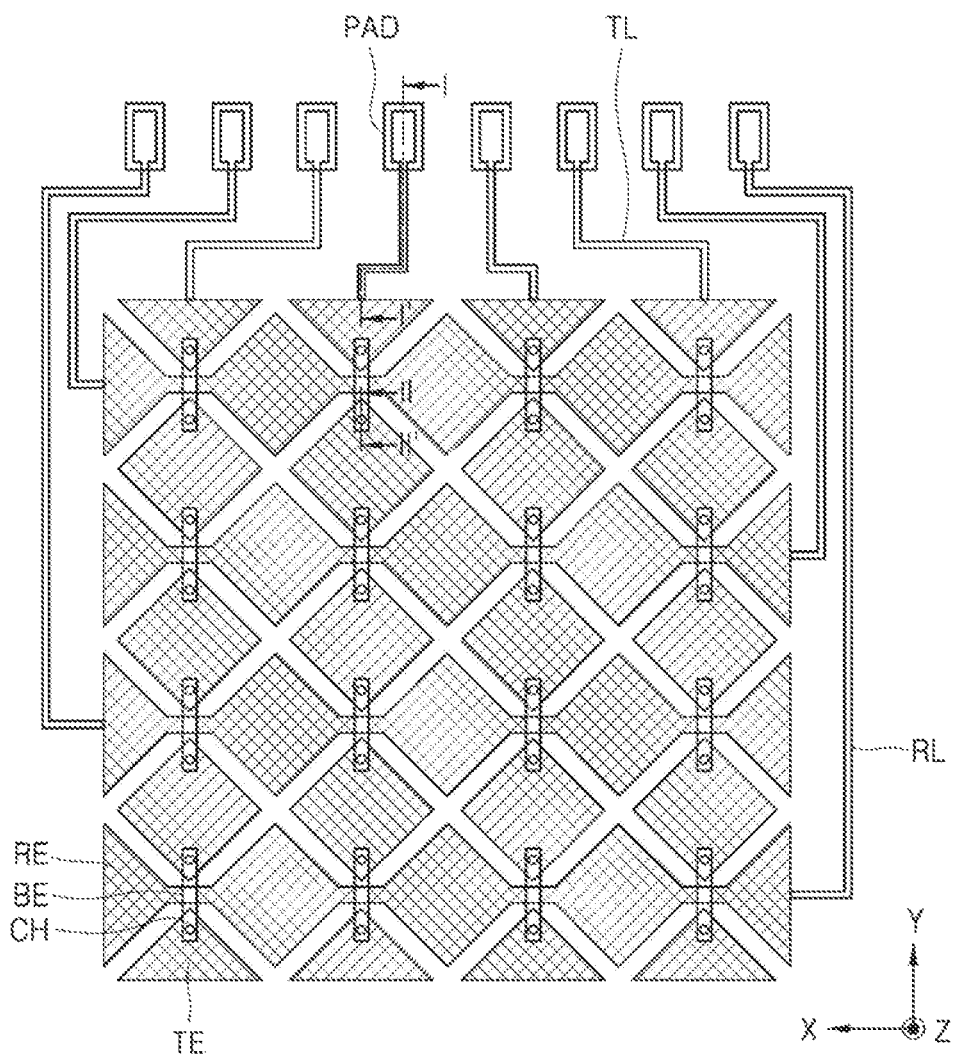
FIG. 4 is a plan view of an example of a touch sensing layer disposed on a first substrate in a touch display device according to one embodiment of the present disclosure.
Figure 5:
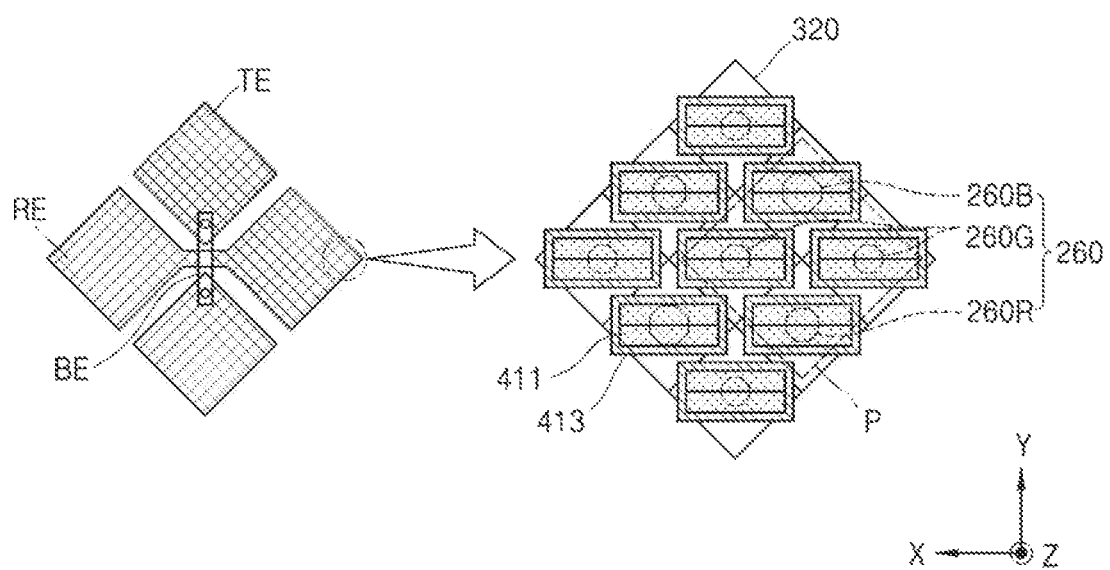
FIG. 5 is an enlarged plan view of a touch electrode of a touch display device according to one embodiment of the present disclosure.
Figure 6:
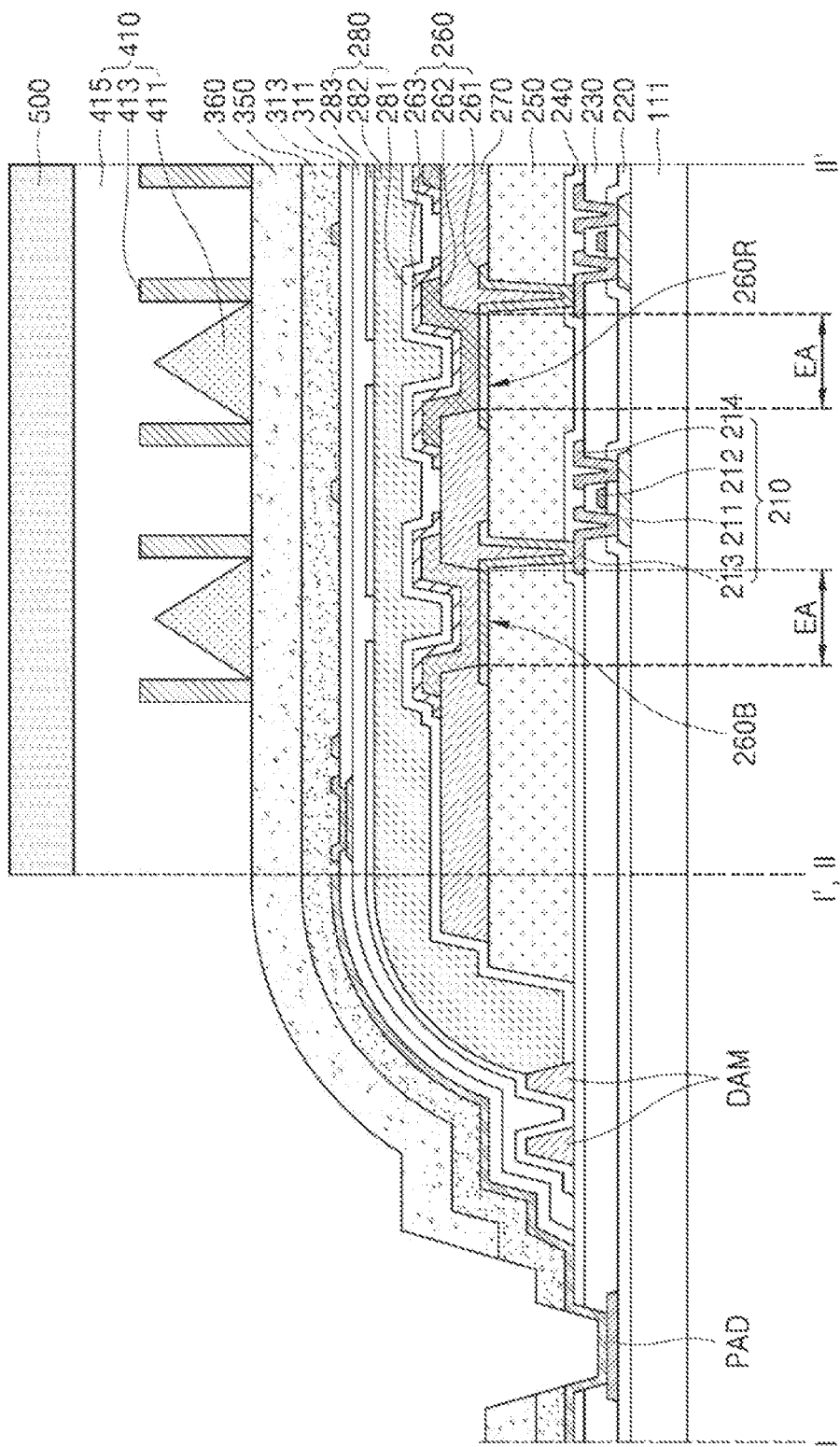
FIG. 6 is a cross-sectional view of one embodiment of I-I' and II-II' of FIG. 4.

Particularly, FIG. 3 is a schematic plan view of a first substrate of a touch display device according to one embodiment of the present disclosure. FIG. 4 is a plan view of an example of a touch sensing layer disposed on a first substrate in a touch display device according to one embodiment of the present disclosure. FIG. 5 is an enlarged plan view of a touch electrode of a touch display device according to one embodiment of the present disclosure. FIG. 6 is a cross-sectional view of one embodiment of I-I' and II-IP of FIG. 4.

Referring to FIGS. 3-6, the first substrate 111 can be named a base substrate, and can include a display area DA and a non-display area NDA.

As described above, the first substrate 111 can be embodied as the glass substrate, or as the plastic substrate made of a polyimide material having flexibility.

The non-display area NDA can include a pad area PA in which the pads PAD are formed, and a dam DAM.

In this case, the dam DAM can include a plural of dams. Further, separate dams can be individually formed in different layers.

The thin-film transistor layer and the organic light-emitting element layer are formed in the display area DA of the first substrate 111.

The thin-film transistor layer includes a thin-film transistor 210, a gate insulating layer 220, an interlayer insulating layer 230, a protective layer 240, and a first planarization layer 250.

A buffer layer can be formed on one face of the first substrate 111. The buffer layer is formed on one face of the first substrate 111 to protect the thin-film transistor 210 and the organic light-emitting element 260 from moisture penetrating through the first substrate 111 vulnerable to moisture permeation. One face of the first substrate 111 can be a face facing toward the second substrate 112. The buffer layer can be composed of a plurality of inorganic layers as stacked alternately. For example, the buffer layer can be composed of multiple layers in which at least one inorganic film among a silicon oxide film $SiO_x$, a silicon nitride film $SiN_x$, and SiON is alternately stacked.

The thin-film transistor 210 is formed on the buffer layer. The thin-film transistor 210 includes an active layer 211, a gate electrode 212, a source electrode 213 and a drain electrode 214. In the present disclosure, it is illustrated that the thin-film transistor 210 is of a top gate type where the gate electrode 212 is located above the active layer 211. The present disclosure is not limited thereto. The thin-film transistor 210 can be of a bottom gate type or a double gate type.

The active layer 211 is formed on the buffer layer. The active layer 211 can be made of an oxide semiconductor material such as IGZO (Indium Gallium Zinc Oxide), but is not limited thereto. The active layer 211 can be made of low temperature polycrystalline silicon (LTPS) or amorphous silicon (a-Si).

A light-blocking layer can be formed between the buffer layer and the active layer 211 to prevent the external light from being incident on the active layer 211.

On the active layer 211, the gate insulating layer 220 that insulates the active layer 211 and the gate electrode 212 from each other can be formed. In the present disclosure, it is illustrated that the gate insulating layer 220 is formed over an entire first substrate 111. The present disclosure is not limited thereto. The gate insulating layer 220 can only be formed under the gate electrode 212. The gate insulating layer 220 can be composed of an inorganic material layer, for example, a silicon oxide film $SiO_x$, a silicon nitride film $SiN_x$, or multiple layers thereof.

The gate electrode 212 and a gate line can be formed on the gate insulating layer 220. Each of the gate electrode 212 and the gate line can be composed of a single layer or multiple layers, made of one of molybdenum (Mo), aluminum (Al), chromium (Cr), gold (Au), titanium (Ti), nickel (Ni), neodymium (Nd) and copper (Cu), or an alloy thereof.

The interlayer insulating layer 230 can be formed on the gate electrode 212 and the gate line. The interlayer insulating layer 230 can be composed of an inorganic film, for example, a silicon oxide film $SiO_x$, a silicon nitride film $SiN_x$, or multiple layers thereof.

The source electrode 213, the drain electrode 214, and the data line can be formed on the interlayer insulating layer 230. Each of the source electrode 213 and the drain electrode 214 can be connected to the active layer 211 via each contact hole extending through the gate insulating layer 220 and the interlayer insulating layer 230. Each of the source electrode 213, the drain electrode 214 and the data line can be composed of a single layer or multiple layers, made of one of molybdenum (Mo), aluminum (Al), chromium (Cr), gold (Au), titanium (Ti), nickel (Ni), neodymium (Nd) and copper (Cu), or an alloy thereof.

The protective layer 240 to insulate the thin-film transistor 210 can be formed on the source electrode 213, the drain electrode 214 and the data line. The protective layer 240 can be composed of an inorganic film, for example, a silicon oxide film $SiO_x$, a silicon nitride film $SiN_x$, or a multilayer thereof.

On the protective layer 240, the first planarization layer 250 that flattens a step due to the thin-film transistor 210 can be formed. The first planarization layer 250 can be composed of an organic film made of acrylic resin, epoxy resin, phenolic resin, polyamide resin, and polyimide resin.

On the thin-film transistor layer, the organic light-emitting element layer is formed. The organic light-emitting element layer includes organic light-emitting elements 260 and a bank layer 270.

For example, a plurality of light-emitting elements are arranged in the display area DA. In the present disclosure, a case in which the light-emitting element is embodied as an organic light-emitting element is described by way of example. The present disclosure is not limited thereto.

The organic light-emitting element 260 and the bank layer 270 are formed on the first planarization layer 250. The organic light-emitting element 260 includes a first electrode 261, an organic light-emitting layer 262 and a second electrode 263. The first electrode 261 can act as an anode, while the second electrode 263 can act as a cathode.

The first electrode 261 can be formed on the first planarization layer 250. The first electrode 261 is connected to the source electrode 213 of the thin-film transistor 210 via a contact hole extending through the protective layer 240 and the first planarization layer 250. The first electrode 261 can be made of a metal material with high reflectance. For example, the first electrode 261 can be composed of a stack structure of aluminum and titanium (Ti/Al/Ti), a stack structure of aluminum and ITO (ITO/Al/ITO), an APC alloy, or a stack structure of an APC alloy and ITO (ITO/APC/ITO). In this connection, the APC alloy refers to an alloy of silver (Ag), palladium (Pd), and copper (Cu).

The bank layer 270 can be formed on the first planarization layer 250 so as to cover an edge of the first electrode 261 to partition pixels. For example, the bank layer 270 serves as a pixel defining film that defines the pixels. Specifically, the bank layer 270 can have a plurality of openings OA defined therein. The opening OA can correspond to a light-emitting area EA of the organic light-emitting element 260.

The bank layer 270 can be composed of an organic film made of acrylic resin, epoxy resin, phenolic resin, polyamide resin, or polyimide resin.

The organic light-emitting layer 262 is formed on the first electrode 261 and the bank layer 270. The organic light-emitting layer 262 can include a hole transporting layer, a hole transporting layer, at least one light-emitting layer, and an electron transporting layer. In this case, when the voltage is applied across the first electrode 261 and the second electrode 263, holes and electrons move to the light-emitting layer via the hole transport layer and the electron transport layer, respectively, and are then combined with each other in the light-emitting layer to emit light.

The organic light-emitting layer 262 can be embodied as a white light-emitting layer that emits white light. The organic light-emitting layer 262 can be formed to cover the first electrode 261 and the bank layer 270. The color filter layer 370 including a red color filter, a green color filter, and a blue color filter can be formed on the organic light-emitting element 260 so that the display device 100 can implement various colors.

The second electrode 263 is formed on the organic light-emitting layer 262. When the display device 100 has a top emission structure, the second electrode 263 can be made of a transparent conductive material (TCO) such as ITO or IZO that can transmit light therethrough, or a semi-transmissive conductive material such as magnesium (Mg), silver (Ag), or an alloy of magnesium (Mg) and silver (Ag). In this connection, the second electrode 263 can be divided into a plurality of sub-electrodes which can be spaced from each other and can respectively correspond to a plurality of light-emitting areas EA. Adjacent sub-electrodes on the bank layer 270 can be spaced from each other.

On the organic light-emitting element layer, the encapsulation layer 280 is formed, which extends to the display area DA of the first substrate 111 as well as the non-display area thereof NDA to cover the plurality of light-emitting elements.

The encapsulation layer 280 serves to prevent the penetration of oxygen or moisture into the organic light-emitting layer 262 and the second electrode 263. To this end, the encapsulation layer 280 can include at least one inorganic film and at least one organic film. For example, the encapsulation layer 280 can include a first inorganic encapsulation film 281, an organic encapsulation film 282, and a second inorganic encapsulation film 283.

The first inorganic encapsulation film 281 can be disposed on the second electrode 263. The first inorganic encapsulation film 281 can be formed to cover the second electrode 263. The organic encapsulation film 282 can be disposed on the first inorganic encapsulation film 281. The organic encapsulation film 282 can be formed to have a sufficient thickness to prevent foreign particles from invading through the first inorganic encapsulation film 281 into the organic light-emitting layer 262 and second electrode 263. The second inorganic encapsulation film 283 can be disposed on the organic encapsulation film 282. The second inorganic encapsulation film 283 can be formed to cover the organic encapsulation film 282.

In this connection, the second inorganic encapsulation film 283 can include a plurality of openings respectively arranged to correspond to the plurality of prism patterns 411 as described later. The second inorganic encapsulation film 283 can include the plurality of openings respectively arranged in the plurality of light-emitting areas EA.

Each of the first and second inorganic encapsulation films 281 and 283 can be made of silicon nitride, aluminum nitride, zirconium nitride, titanium nitride, hafnium nitride, tantalum nitride, silicon oxide, aluminum oxide, or titanium oxide.

The organic encapsulation film 282 can include acrylic resin, or epoxy resin.

The display device 100 can include the dam DAM in a form of a closed curve disposed in the non-display area NDA to surround the organic encapsulation film 282. The dam DAM is formed to surround an outer edge of the display area DA to block flow of the organic encapsulation film 282 constituting the encapsulation layer 280. Thus, the dam DAM can prevent the organic encapsulation film 282 from being exposed to the outside of the display device 100 or invading the pad area PA.

The dam DAM can include a single dam. However, the present disclosure is not limited thereto. When forming a plurality of dams DAMs, the flow of the organic encapsulation film 282 can be more effectively blocked. In the present disclosure, as shown in FIG. 6, two dams DAMs are formed. The present disclosure is not limited thereto.

This dam DAM can be formed simultaneously with the first planarization layer 250 or the bank layer 270, and can be made of a material such as that of the first planarization layer 250 or the bank layer 270.

The second inorganic encapsulation film 283 can be formed to cover the dam DAM.

The touch sensing layer is formed on the encapsulation layer 280. The touch sensing layer can include touch electrodes 320 including first touch electrodes TE and second touch electrodes RE, bridge electrodes BE, a touch buffer layer 311, and an insulating layer 313.

First, the touch buffer layer 311 can be formed on the encapsulation layer 280 in the display area DA and the non-display area NDA, and can be formed such that the pad PAD is exposed in the non-display area NDA. The touch buffer layer 311 can be formed to cover the dam DAM.

The touch buffer layer 311 prevents foreign substances such as chemical solutions such as a development solution or an etching solution used in the manufacturing process of the touch electrodes formed on the touch buffer layer 311 or external moisture from penetrating into the organic light-emitting element 260 including an organic material.

The bridge electrodes BE are formed on the touch buffer layer 311. The bridge electrodes BE are formed in the display area DA. The first touch electrodes TE formed on the insulating layer 313 can be electrically connected to each other via the bridge electrodes BE.

In order to prevent the first touch electrode TE and the second touch electrode RE from being short-circuited with each other in a crossing area therebetween, the first touch electrodes TE adjacent to each other in a second direction (y axis direction) as shown in FIG. 4 can be electrically connected to each other via the bridge electrode BE. The bridge electrode BE can be disposed in a layer different from a layer in which the first and second touch electrodes TE and RE are formed. The bridge electrode BE can be connected to mutually adjacent first touch electrodes TE via a contact hole CH. The bridge electrode BE can intersect with the second touch electrode RE.

In this case, the contact holes CH can extend through the insulating layer 313. The bridge electrode BE can be disposed under the insulating layer 313 and can be exposed through two contact holes. Accordingly, the bridge electrode BE can be connected to the adjacent two first touch electrodes TE.

The insulating layer 313 can be formed on the touch buffer layer 311 to cover the bridge electrodes BE, so that the bridge electrodes BE and the second touch electrodes RE can be insulated from each other. Further, the insulating layer 313 can be disposed between the bridge electrodes BE to insulate the bridge electrodes BE from each other.

The insulating layer 313 can extend not only to the display area DA but also to the non-display area NDA. The insulating layer 313 can be formed to cover the dam DAM area, so that a step caused by the dam DAM can be reduced.

The plurality of touch electrodes 320 having a mesh shape are formed on the insulating layer 313. The touch electrodes 320 include first touch electrodes TE and second touch electrodes RE.

The first touch electrodes TE and the second touch electrodes RE are formed in the display area DA. The first touch electrodes TE can be connected to each other in the second direction (y axis direction), while the second touch electrodes RE can be connected to each other in a first direction (e.g., x axis direction). In this connection, a second direction (e.g., y axis direction) can be parallel to the scan lines S1 to Sn, while the first direction (x axis direction) can be parallel to the data lines D1 to Dm. Alternatively, the second direction (y axis direction) can be parallel to the data lines D1 to Dm, while the first direction (x axis direction) can be parallel to the scan lines S1 to Sn.

Each of the first touch electrodes TE connected to each other in the second direction (y axis direction) can be electrically insulated from the first touch electrodes TE adjacent thereto in the first direction (x axis direction). Each of the second touch electrodes RE connected to each other in the first direction (x axis direction) can be electrically insulated from the second touch electrodes RE adjacent thereto in the second direction (y axis direction).

For this reason, mutual capacitance corresponding to the touch sensor can be generated in a crossing area between the first touch electrode TE and the second touch electrode RE.

For example, as shown in FIG. 5, the touch electrodes 320 can have a mesh shape to have openings defined therein.

The touch electrode 320 can be formed to have the mesh shape, such that the organic light-emitting elements 260 can correspond to the openings of the touch electrode 320, thereby improving the light emission efficiency.

The touch electrode 320 can be positioned to correspond to the bank layer 270. The bank layer 270 can have a plurality of openings defined therein as described above. The openings correspond to the light-emitting areas EA of the organic light-emitting element 260. Thus, the openings of the touch electrode 320 can be arranged to correspond to the openings of the bank layer 270.

Accordingly, the touch electrode 320 can be disposed along the bank layer 270 so as to correspond to the bank layer 270. As the touch electrode 320 can be positioned to correspond to the bank layer 270, the openings of the touch electrode 320 can also be arranged to correspond to the light-emitting areas EA, so that the openings of the touch electrode 320 overlap the light-emitting areas EA. As a result, it is possible to minimize the decrease in the light emission efficiency.

In one example, the pad PAD can be disposed in the non-display area NDA. On the insulating layer 313, a touch routing wire 330 for electrically connecting the pad PAD and the touch electrode 320 to each other can be formed.

In this case, the pad PAD can be made of the same material on the same layer as the gate electrode 212. The touch routing wire 330 can be made of the same material on the same layer as the touch electrode 320.

A touch protective layer 350 covering the touch electrode 320 and the touch routing wire 330 can be disposed on the insulating layer 313. A passivation layer 360 can be disposed on the touch protective layer 350. The touch protective layer 350 and the passivation layer 360 can be formed such that the pad PAD in the non-display area NDA can be exposed.

A light control layer 410 can be disposed on the passivation layer 360. The light control layer 410 includes a plurality of prism patterns 411 corresponding to the plurality of openings defined in the touch electrode 320, respectively, and a plurality of reflective partition walls 413 respectively surrounding the plurality of prism patterns 411. The light control layer 410 can further include a second planarization layer 415 covering the plurality of prism patterns 411 and the plurality of reflective partition walls 413.

The plurality of prism patterns 411 can be respectively disposed on the plurality of organic light-emitting elements 260. Each prism pattern 411 can extend in the first direction (x direction) beyond each organic light-emitting element 260. The plurality of prism patterns 411 can be arranged parallel to each other and spaced from each other in the first direction. Accordingly, the plurality of reflective partition walls 413 respectively surrounding the plurality of prism patterns 411 can extend in the first direction (x direction), and be arranged parallel to each other and spaced from each other in the first direction (x direction). The first direction (e.g., x direction) can be a long-side direction, a horizontal direction, or a left-right direction in a rectangular display device having a ratio of a long side length and a short side length of 16:9 in one example. The second direction (e.g., y direction) can be, for example, a short-side direction, a vertical direction, or an up-down direction in a rectangular display device having a long side length: a short side length=16:9.

Since a distance from a center of the organic light-emitting element 260 to each of portions of the reflective partition walls 413 arranged in the vertical direction is shorter than a distance from the center of the organic light-emitting element 260 to each of portions of the reflective partition walls 413 arranged in the horizontal direction, a light beam emitted from the organic light-emitting element 260 in the vertical direction can be blocked with the reflective partition walls 413.

Therefore, the display device according to one embodiment of the present disclosure can control or cut off the vertical viewing angle without attaching the light control film to the surface of the panel. Therefore, when the display device according to one embodiment of the present disclosure is applied, for example, to an automobile, the image from the display device can be prevented from being reflected from the windshield of the car to obstruct the view of the driver while the driver is driving. In addition, when the display device according to one embodiment of the present disclosure is applied, for example, to a personal terminal such as a mobile phone, the privacy protection can be achieved.

Further, the prism pattern 411 can condense light emitted from the organic light-emitting element 260 in a front direction of the display device. A vertical dimension of each of the plurality of reflective partition walls 413 can be greater than a vertical dimension of each of the plurality of prism patterns 411. Accordingly, the reflective partition wall 413 can reflect light beams that have passed through the plurality of prism patterns 411, thereby improving light extraction efficiency. The reflective partition wall 413 can be made of a photosensitive resin containing reflective particles dispersed therein. The reflective particles can be made of, for example, titanium dioxide ($TiO_2$) or the like.

A refractive index of the plurality of prism pattern 411 can be greater than that of the second planarization layer 415. When the refractive index of the second planarization layer 415 covering the plurality of prism patterns 411 is lower than the refractive index of each of the plurality of prism patterns 411, the light condensing efficiency and the light output efficiency can be improved due to the difference in the refractive index.

For example, the prism pattern 411 can have a refractive index of 1.5 to 1.8, while the second planarization layer 415 can have a refractive index of 1.3 to 1.5. It is desirable that the difference between the refractive indexes thereof is as large as possible.

The prism pattern 411 can be made of for example, a urethane acrylate-based photosensitive resin. The second planarization layer 415 can be made of an acrylic photo-sensitive resin in one example. The second planarization layer 415 can be made from a composition including, for example, an acrylate monomer having an epoxy group, an oxime ester-based photo-initiator, and a solvent. The solvent can include isopropyl alcohol (IPA), acetone, toluene, benzene, chloroform, n-methyl pyrrolidone (NMP), polyethylene glycol (PEG), and propylene glycol methyl ether acetate (PGMEA)

The display device according to one embodiment of the present disclosure can further include a polarizing plate 500 disposed on a top face of the light control layer 410. External light reflection can be reduced due to the polarizer 500.

Figure 9:
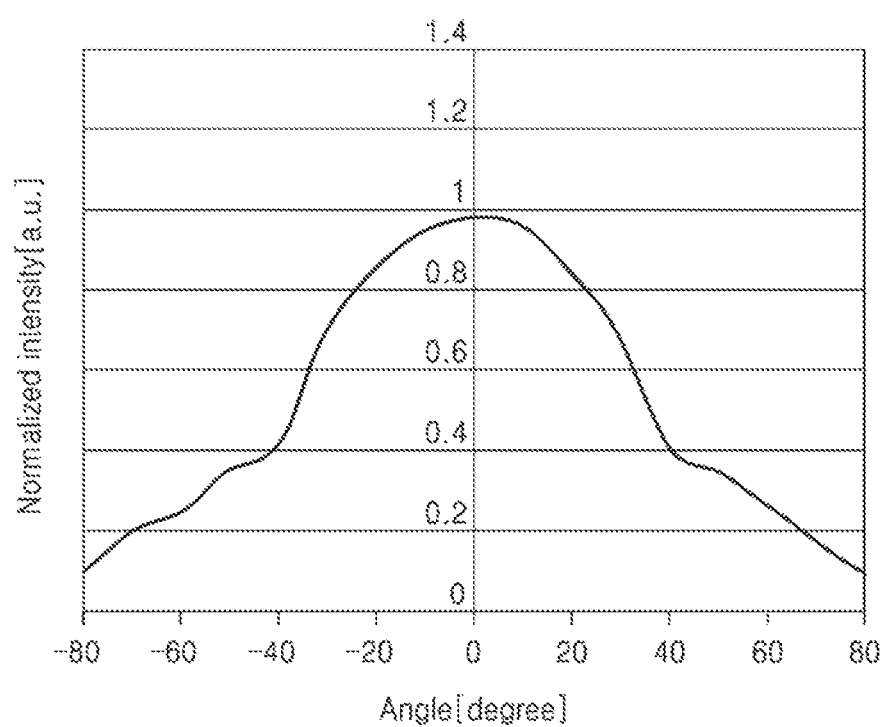
FIG. 9 is a drawing showing an example of a normalized intensity of light based on a viewing angle in a comparative example.
Figure 10:
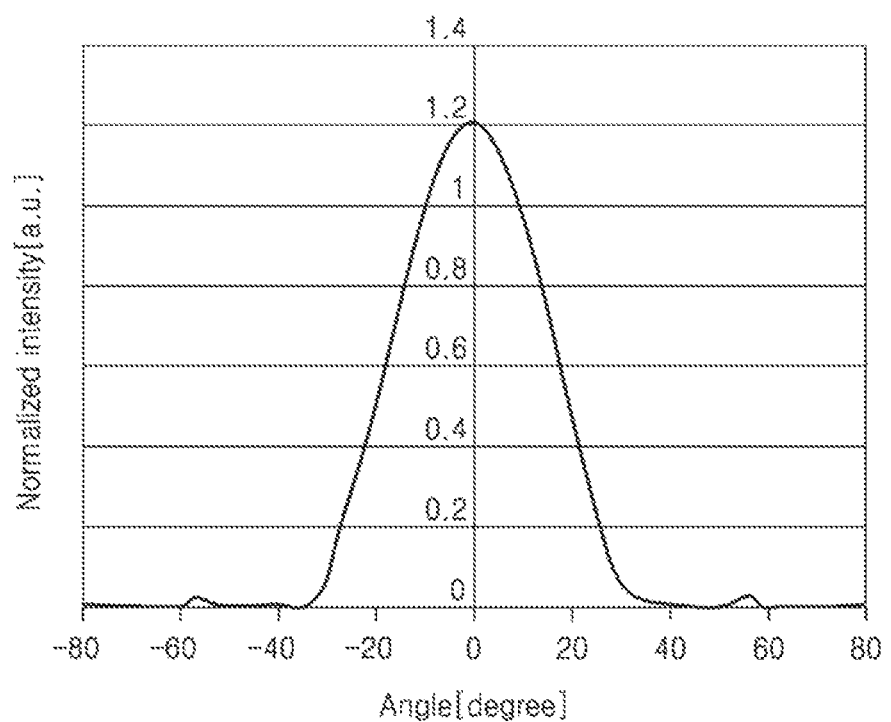
FIG. 10 is a drawing showing an example of a normalized intensity of light based on a viewing angle in the present example.

FIG. 9 is a drawing showing an example of a normalized intensity of light based on a vertical viewing angle in a comparative example. FIG. 10 is a drawing showing an example of a normalized intensity of light based on the vertical viewing angle in the present embodiment. In this connection, the comparative example refers to a display device that does not include the light control layer according to the present disclosure.

Referring to FIG. 9 and FIG. 10, it can be identified that the display device according to the embodiment of the present disclosure has a much narrower vertical viewing angle range and improved front-directional luminance, compared to the display device according to the comparative example. In the display device according to the embodiment of the present disclosure, the vertical viewing angle range can be narrowed to about ±30 degrees as the front-directional luminance is improved.

Returning to FIGS. 7 and 8, FIG. 7 and FIG. 8 are plan views of a light control layer according to an embodiment of the present disclosure. Hereinafter, descriptions will be omitted which are related to the content that is duplicated with reference to the display device according to one embodiment of the present disclosure as described above based on FIGS. 5 and 6. Rather, differences therebetween will be mainly described. The contents omitted from the descriptions below can refer to the contents of one embodiment of the present disclosure as described based on FIGS. 5 and 6.

Figure 7:
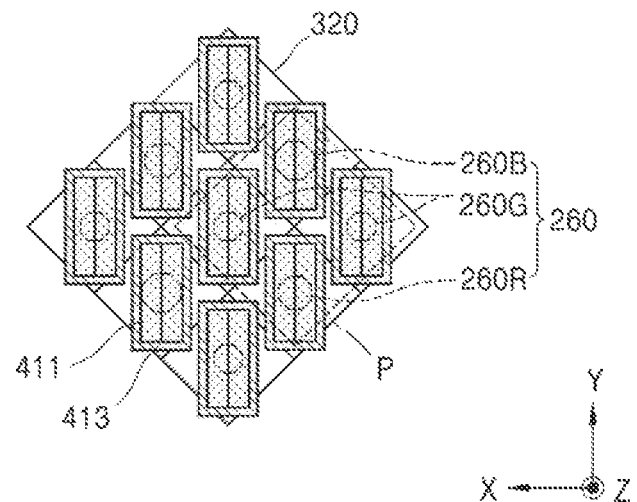
FIG. 7 and FIG. 8 are plan views of a light control layer according to an embodiment of the present disclosure.

Referring to FIG. 7, each of the plurality of prism patterns 411 respectively arranged to correspond to the plurality of openings defined in the touch electrode 320 can extend, in the second direction (y direction), beyond each of the plurality of organic light-emitting elements 260. The plurality of prism patterns 411 can be arranged and spaced from each other in the second direction. Accordingly, each of the plurality of reflective partition walls 413 respectively surrounding the plurality of prism patterns 411 can extend in the second direction (y direction). The plurality of reflective partition walls 413 can be arranged and spaced from each other in the second direction. The second direction (y direction) can be, for example, a short-side direction, a vertical direction, or an up-down direction in a rectangular display device having a long side length: a short side length=16:9.

Therefore, the display device according to one embodiment of the present disclosure can control or cut off the horizontal viewing angle without attaching the light control film to the surface of the panel. Therefore, when the display device according to one embodiment of the present disclosure is applied, for example, to an automobile, the image from the display device can be prevented from being reflected from the windshield of the automobile to prevent obstruction of the view of the driver while the driver is driving. In addition, when the display device according to one embodiment of the present disclosure is applied, for example, to a personal terminal such as a mobile phone, the privacy protection can be achieved.

Figure 8:
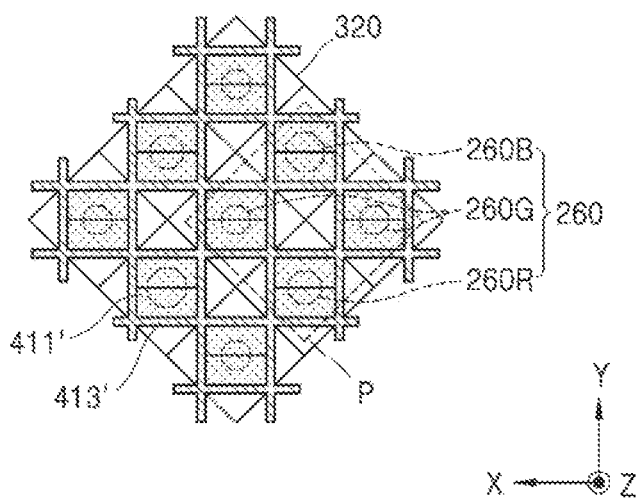

Referring to FIG. 8, a plurality of reflective partition walls are connected to each other to form a mesh-shaped reflective partition wall 413'. The mesh-shaped reflective partition wall 413' can include a plurality of square-shaped openings. The plurality of prism patterns 411 can be respectively disposed in some of the plurality of openings of the reflective partition wall 413'. Specifically, the plurality of prism patterns 411 can be respectively disposed in some openings corresponding to the plurality of openings of the touch electrode 320, among the plurality of openings of the reflective partition wall 413'. Each of the plurality of prism patterns 411 can extend, in the first direction (x direction), beyond each of the plurality of organic light-emitting elements 260. The plurality of prism patterns 411 can be arranged parallel to each other and spaced from each other in the first direction.

Accordingly, each of the plurality of reflective partition walls 413 respectively surrounding the plurality of prism patterns 411 can extend in the first direction (x direction). The first direction (x direction) can be a long-side direction, a horizontal direction, or a left-right direction in a rectangular display device having a ratio of a long side length and a short side length of 16:9 in one example. Alternatively, each of the plurality of prism patterns 411 can extend, in the second direction (y direction), beyond each of the plurality of organic light-emitting elements 260. The plurality of prism patterns 411 can be arranged parallel to each other and spaced from each other in the second direction. Accordingly, each of the plurality of reflective partition walls 413 respectively surrounding the plurality of prism patterns 411 can extend in the second direction (y direction). The second direction (y direction) can be, for example, a short-side direction, a vertical direction, or an up-down direction in a rectangular display device having a long side length: a short side length=16:9.

Therefore, the display device according to one embodiment of the present disclosure in which each of the prism patterns 411 is disposed in each of the square openings of the reflective partition wall 413' can control or cut off the horizontal and vertical viewing angles without attaching the light control film to the surface of the panel. Therefore, when the display device according to one embodiment of the present disclosure is applied, for example, to an automobile, the image from the display device can be prevented from being reflected from the windshield of the automobile to prevent obstruction of the view of the driver while the driver is driving. In addition, when the display device according to one embodiment of the present disclosure is applied, for example, to a personal terminal such as a mobile phone, the privacy protection can be achieved.

Embodiments of the present disclosure can be described as follows.

A first aspect of the present disclosure provides a display device comprising a base substrate including a display area and a non-display area, a plurality of organic light-emitting elements disposed in the display area, an encapsulation layer disposed to cover the plurality of organic light-emitting elements, a mesh-shaped touch electrode disposed on the encapsulation layer, and a light control layer disposed on the touch electrode, wherein the light control layer includes a plurality of prism patterns arranged respectively to correspond to a plurality of openings defined in the mesh-shaped touch electrode, and a plurality of reflective partition walls respectively surrounding the plurality of prism patterns.

In one implementation of the first aspect, the plurality of openings defined in the touch electrode are arranged respectively to correspond to the plurality of organic light-emitting elements, wherein each of the plurality of prism patterns extends beyond each of the plurality of organic light-emitting elements in one direction, and the plurality of prism patterns are arranged parallel to each other and spaced from each other in the one direction.

In one implementation of the first aspect, a vertical dimension of each of the plurality of reflective partition walls is greater than a vertical dimension of each of the plurality of prism patterns.

In one implementation of the first aspect, the plurality of reflective partition walls are connected to each other to form a mesh-shaped reflective partition wall structure.

In one implementation of the first aspect, the light control layer further includes a planarization layer covering the plurality of prism patterns and the plurality of reflective partition walls.

In one implementation of the first aspect, a refractive index of each of the plurality of prism patterns is greater than a refractive index of the planarization layer.

In one implementation of the first aspect, each of the plurality of reflective partition walls is made of a photosensitive resin containing reflective particles dispersed therein.

In one implementation of the first aspect, the plurality of organic light-emitting elements respectively have mutually-spaced cathodes.

In one implementation of the first aspect, the encapsulation layer includes a first inorganic encapsulation film disposed on the plurality of organic light-emitting elements, an organic encapsulation film disposed on the first inorganic encapsulation film, and a second inorganic encapsulation film disposed on the organic encapsulation film, wherein the second inorganic encapsulation film has a plurality of openings defined therein arranged respectively to correspond to the plurality of prism patterns.

In one implementation of the first aspect, the device further comprises a polarizing plate disposed on the light control layer.

A second aspect of the present disclosure provides a display device comprising base substrate including a display area and a non-display area, a bank layer disposed in the display area, wherein the bank layer has a plurality of openings defined therein, a plurality of organic light-emitting elements respectively disposed in the plurality of openings defined in the bank layer, an encapsulation layer disposed to cover the plurality of organic light-emitting elements, and a light control layer disposed on the encapsulation layer, wherein the light control layer includes a plurality of prism patterns arranged respectively to correspond to the plurality of organic light-emitting elements, a plurality of reflective partition walls respectively surrounding the plurality of prism patterns, and a planarization layer covering the plurality of prism patterns and the plurality of reflective partition walls.

In one implementation of the second aspect, each of the plurality of prism patterns extends beyond each of the plurality of organic light-emitting elements in one direction, wherein the plurality of prism patterns are arranged parallel to each other and spaced from each other in the one direction.

In one implementation of the second aspect, a vertical dimension of each of the plurality of reflective partition walls is greater than a vertical dimension of each of the plurality of prism patterns.

In one implementation of the second aspect, the plurality of reflective partition walls are connected to each other to form a mesh-shaped reflective partition wall structure.

In one implementation of the second aspect, a refractive index of each of the plurality of prism patterns is greater than a refractive index of the planarization layer.

In one implementation of the second aspect, each of the plurality of reflective partition walls is made of a photosensitive resin containing reflective particles dispersed therein.

In one implementation of the second aspect, the plurality of organic light-emitting elements respectively have mutually-spaced cathodes.

In one implementation of the second aspect, the encapsulation layer includes a first inorganic encapsulation film disposed on the plurality of organic light-emitting elements, an organic encapsulation film disposed on the first inorganic encapsulation film, and a second inorganic encapsulation film disposed on the organic encapsulation film, wherein the second inorganic encapsulation film has a plurality of openings defined therein arranged respectively to correspond to the plurality of prism patterns.

In one implementation of the second aspect, the device further comprises a polarizing plate disposed on the light control layer.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments.

Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display device comprising:
   a base substrate including a display area and a non-display area;
   a plurality of organic light-emitting elements disposed in the display area;
   an encapsulation layer disposed to cover the plurality of organic light-emitting elements;
   a mesh-shaped touch electrode disposed on the encapsulation layer; and
   a light control layer disposed on the mesh-shaped touch electrode,
   wherein the light control layer includes:
      a plurality of prism patterns arranged respectively to correspond to a plurality of openings defined in the mesh-shaped touch electrode; and
      a plurality of reflective partition walls respectively surrounding the plurality of prism patterns,
   wherein the encapsulation layer includes:
      a first inorganic encapsulation film disposed on the plurality of organic light-emitting elements;
      an organic encapsulation film disposed on the first inorganic encapsulation film; and
      a second inorganic encapsulation film disposed on the organic encapsulation film, and
   wherein the second inorganic encapsulation film has a plurality of openings arranged respectively to correspond to the plurality of prism patterns.

2. The display device of claim 1, wherein the plurality of openings defined in the mesh-shaped touch electrode are arranged respectively to correspond to the plurality of organic light-emitting elements,
   wherein each of the plurality of prism patterns extends beyond each of the plurality of organic light-emitting elements in one direction, and
   wherein the plurality of prism patterns are arranged parallel to each other and are spaced from each other in the one direction.

3. The display device of claim 1, wherein a vertical dimension of each of the plurality of reflective partition walls is greater than a vertical dimension of each of the plurality of prism patterns.

4. The display device of claim 1, wherein the plurality of reflective partition walls are connected to each other to form a mesh-shaped reflective partition wall structure.

5. The display device of claim 1, wherein the light control layer further includes a planarization layer covering the plurality of prism patterns and the plurality of reflective partition walls.

6. The display device of claim 5, wherein a refractive index of each of the plurality of prism patterns is greater than a refractive index of the planarization layer.

7. The display device of claim 1, wherein each of the plurality of reflective partition walls is made of a photosensitive resin containing reflective particles dispersed therein.

8. The display device of claim 1, wherein the plurality of organic light-emitting elements respectively have mutually-spaced cathodes.

9. The display device of claim 1, further comprising a polarizing plate disposed on the light control layer.

10. The display device of claim 1, further comprising a polarizing plate disposed on the light control layer.

11. A display device comprising:
- a base substrate including a display area and a non-display area;
- a bank layer disposed in the display area, wherein the bank layer has a plurality of openings defined therein;
- a plurality of organic light-emitting elements respectively disposed in the plurality of openings defined in the bank layer;
- an encapsulation layer disposed to cover the plurality of organic light-emitting elements; and
- a light control layer disposed on the encapsulation layer, wherein the light control layer includes:
  - a plurality of prism patterns arranged respectively to correspond to the plurality of organic light-emitting elements;
  - a plurality of reflective partition walls respectively surrounding the plurality of prism patterns; and
  - a planarization layer covering the plurality of prism patterns and the plurality of reflective partition walls, wherein the encapsulation layer includes:
- a first inorganic encapsulation film disposed on the plurality of organic light-emitting elements;
- an organic encapsulation film disposed on the first inorganic encapsulation film; and
- a second inorganic encapsulation film disposed on the organic encapsulation film, and wherein the second inorganic encapsulation film has a plurality of openings arranged respectively to correspond to the plurality of prism patterns.

12. The display device of claim 11, wherein each of the plurality of prism patterns extends beyond each of the plurality of organic light-emitting elements in one direction, and wherein the plurality of prism patterns are arranged parallel to each other and are spaced from each other in the one direction.

13. The display device of claim 11, wherein a vertical dimension of each of the plurality of reflective partition walls is greater than a vertical dimension of each of the plurality of prism patterns.

14. The display device of claim 11, wherein the plurality of reflective partition walls are connected to each other to form a mesh-shaped reflective partition wall structure.

15. The display device of claim 11, wherein a refractive index of each of the plurality of prism patterns is greater than a refractive index of the planarization layer.

16. The display device of claim 11, wherein each of the plurality of reflective partition walls is made of a photosensitive resin containing reflective particles dispersed therein.

17. The display device of claim 11, wherein the plurality of organic light-emitting elements respectively have mutually-spaced cathodes.

* * * * *